United States Patent [19]
Yoshimura et al.

[11] Patent Number: 4,587,095
[45] Date of Patent: May 6, 1986

[54] SUPER HEATRESISTANT CERMET AND PROCESS OF PRODUCING THE SAME

[75] Inventors: Hironori Yoshimura; Naohisa Ito, both of Tokyo; Kenichi Nishigaki; Katsunori Anzai, both of Omiya, all of Japan

[73] Assignee: Mitsubishi Kinzoku Kabushiki Kaisha, Tokyo, Japan

[21] Appl. No.: 570,282

[22] Filed: Jan. 12, 1984

[30] Foreign Application Priority Data

Jan. 13, 1983 [JP] Japan ............................ 58-3687
Mar. 23, 1983 [JP] Japan ........................... 58-48498

[51] Int. Cl.$^4$ ............... C22C 29/04; C22C 29/12; B22F 3/16; B22F 3/24
[52] U.S. Cl. .................................. 419/13; 419/14; 419/15; 419/16; 75/235; 75/238; 75/248; 428/551; 428/552
[58] Field of Search ............... 75/235, 233, 230, 232, 75/238, 248; 428/551, 552; 419/13, 14, 15, 16, 19; 30/165

[56] References Cited

U.S. PATENT DOCUMENTS 4,447,263  5/1984  Sugizawa et al. ................ 75/233

FOREIGN PATENT DOCUMENTS 57-230408  12/1982  Japan .

Primary Examiner—Allan M. Lieberman
Attorney, Agent, or Firm—Cushman, Darby & Cushman

[57] ABSTRACT

A super heatresistant cermet and process of producing the same. A mixture, which contains about 10 to about 65% by weight of a powder of the carbonitride having titanium and tungsten, about 0.5 to about 10.0% by weight of a magnesium oxide powder and a tungsten powder, is pressed to form a compact, which is thereafter sintered in a vacuum or in an atmosphere of a nitrogen gas or an inert gas within the temperature range of about 1800° to 2700° C. to thereby decarburize the carbonitride with the magnesium oxide evaporated during the sintering, whereby there is produced a super heatresistant cermet containing about 10 to about 65% by weight of a carbonitride containing titanium and tungsten, about 0.01 to about 1.0% by weight of magnesium oxide, and tungsten as a binder. The super heatresistant cermet is excellent in impact resistance, wear resistance and plastic deformation resistance, and suitable for cutting tools.

20 Claims, No Drawings

SUPER HEATRESISTANT CERMET AND PROCESS OF PRODUCING THE SAME

The present invention relates to a super heatresistant cermet containing tungsten as a binder and a process of producing the same. The super heatresistant cermet according to the present invention has excellent properties in plastic deformation resistance, wear resistance and impact resistance, combined with high strength and hardness, and therefore exhibits excellent performances in use where such properties are required, for instance, cutting tools used in high speed cutting, heavy cutting, such as cutting with large feed per revolution or with large depth of cut, and hot working tools such as hot reduction roll, hot wiredrawing roll, hot press die, hot forging die and hot extrusion punch.

In order to improve machining in efficiency, there is a strong need for cutting at a higher speed and feed. The higher the cutting speed and feed the higher the temperature of a cutting edge of the cutting tool. The life of the cutting tool is thus largely shortened rather by plastic deformation due to the high temperature than by wear of the cutting edge.

Among alloys for cutting tools currently used, there are a cemented tungsten carbide alloy having a hard phase composed of a larger proportion of tungsten carbide (hereinafter referred to as WC), and a titanium carbide cermet having a hard phase composed of a larger proportion of titanium carbide (hereinafter referred to as TiC), both the alloys having binder phases containing iron group metals such as cobalt and nickel which have low melting points. Therefore, blades and cutting tool inserts made of these alloys are rapidly softened when the temperature of their cutting edges exceeds 1000° C. For this reason, not only blade members made of these alloys but also such blade members coated with hard coating layers have a limitation that the temperature of their cutting edges should be lower than about 1000° C.

Further, there has been proposed a cermet having a hard phase composed of a carbonitride having titanium and tungsten (hereinafter referred to as (Ti, W)C,N) and a binder phase composed of W which has a high melting point. In this prior art cermet, grain growth occurs in (Ti, W)C,N and W, resulting in degradation in impact resistance and oxidation resistance. In order to use this cermet for cutting tools for high speed cutting and heavy cutting, the inventors have proposed a tungsten cermet for cutting tools in Japanese Patent Application Nos. 57-230408 and 57-230409, both applications filed on Dec. 24, 1982 and corresponding to a U.S. patent application filed on Dec. 24, 1983, entitled "Tungsten Cermet", the disclosure of which is incorporated herein by reference. The tungsten cermet includes about 10 to about 50% by weight of a carbonitride having titanium and tungsten, about 0.5 to about 10% by weight of aluminum oxide and tungsten as a binder. Cutting tools made of this tungsten cermet exhibit excellent thermoplastic deformation resistance and oxidation resistance. Howver, this tungsten cermet has a problem in that brittle $W_2C$ is formed by a reaction of part of the carbon in a (Ti, W)C,N powder with part of the tungsten as a binder metal during sintering. Thus, the cutting tools made of this cermet cannot exhibit excellent impact resistance in high speed cutting and heavy cutting.

The inventors have further studied the tungsten cermet and unexpectedly found a super heatresistant cermet for use in cutting tools, including about 10 to about 65% by weight of a carbonitride containing titanium and tungsten, about 0.01 to about 1.0% by weight of magnesium oxide, and tungsten as a binder. This cermet is excellent in impact resistance, plastic deformation resistance and wear resistance, and blade members made of the cermet exhibit excellent cutting performances in high speed cutting and heavy cutting.

The super heatresistant cermet according to the present invention is produced by the following process. A mixture is prepared by mixing about 10 to about 65% by weight of a powder of the carbonitride having titanium and tungsten, about 0.5 to about 10.0% by weight of a magnesium oxide powder and a tungsten powder. Then, the mixture is pressed to form a compact, which is thereafter sintered in a vacuum or in an atmosphere of a nitrogen gas or an inert gas within a temperature range of about 1800° to 2700° C. to thereby decarburize the carbonitride with the magnesium oxide evaporated during the sintering, whereby the super heatresistant cermet is produced. In the sintering the concentration of carbon in the (Ti, W)C,N powder is reduced by the reaction of the carbon with MgO, with the result that the sintering is accelerated and little brittle $W_2C$ is produced. Thus, there is produced the super heatresistant cermet which is excellent in impact resistance, wear resistance and plastic deformation resistance.

As the major hard phase constituent element, about 10 to about 65% by weight of (Ti, W)C,N is required in the finished cermet according to the present invention. This element provides the cermet with excellent wear resistance and plastic deformation resistance. However, with less than about 10% by weight of (Ti, W)CN, the (Ti, W)C,N is homogeneously dispersed in the tungsten matrix without forming any skeleton, and hence the intended wearing resistance and plastic deformation resistance cannot be obtained. On the other hand, with more than about 65% the tungsten matrix is formed in an excessively small amount, which results in insufficient toughness of the finished product. The best results are obtained by the use of about 25 to about 55% by weight of (Ti, W)C,N.

The concentration of magnesium oxide in the finished cermet must be according to the present invention in the range of about 0.01 to about 1.0% by weight and preferably in the range of about 0.03 to about 0.2% by weight. The magnesia contained in the compact reduces the content of carbon in the cermet by a reaction of most of it with carbon in the (Ti, W)C,N during sintering and promotes sintering. A trace of MgO in the cermet according to the present invention largely enhances impact resistance, but with less than about 0.5% by weight of magnesium oxide in the mixture or blend the desired result in sintering cannot be obtained. After sintering such mixture results in a cermet containing less than about 0.01% by weight of magnesium oxide, and this cermet does not exhibit sufficient impact resistance. The lower the limit of known measures in capacity for detecting magnesium oxide is about 10% by weight. On the other hand, with more than about 10% by weight of magnesium oxide in the mixture composition the concentration of magnesium oxide in the resulting cermet exceeds 1.0% by weight when sintering is carried out at relatively low temperatures, with the results that the finished product has poor plastic deformation resistance and is liable to be porous, so that impact resistance thereof is deteriorated.

In the present invention, although part of tungsten contained in the cermet is dissolved into the hard phase, a larger part of the tungsten exists as the binder phase and strongly adhered to the hard phase to thereby provide the cermet with excellent toughness and impact resistance.

The sintering temperature must be according to the present invention in the range of from about 1800° C. to about 2700° C. At lower sintering temperatures magnesium oxide is not sufficiently evaporated and hence the content of carbon in the resulting cermet is not appropriately reduced, so that the desired properties of the cermet cannot be obtained. At sintering temperatures higher than about 2700° C., a liquid phase is produced in the cermet during sintering and the shape thereof is hence changed.

The carbonitride according to the present invention may further contain a metal of the group Va, i.e., vanadium, niobium or tantalum. The carbonitride containing titanium, tungsten and a group Va metal is hereinafter referred to as "(Ti, W, M)C,N".

Table 1 below shows permissible concentration ranges and best results ranges of the components of the finished cermet of the present invention.

TABLE 1

| Component Used | Permissible | Percents by Weight For Best Results |
|---|---|---|
| (Ti, W) C,N or (Ti, W, M) C,N | about 10-65 | about 25-55 |
| MgO | about 0.01-1.0 | about 0.03-0.2 |
| W | The rest (about 34-89.99) | The rest (about 44.8-74.97) |

The cermet according to the present invention may further contain aluminum oxide and/or yttrium oxide in the range of from about 0.5 to about 10% by weight, and preferably in the range of about 2 to about 6% by weight. Yttrium oxide and aluminum oxide are homogeneously dispersed in the tungsten matrix to improve oxidation resistance of the cermet of the present invention. Aluminum oxide and/or yttrium oxide should be present in the mixture and the resulting cermet in an amount of at least about 0.5% by weight since lower amounts do not provide such improved properties. On the other hand amounts in excess of about 10% by weight in the mixture and the resulting cermet degrade the cermet in impact resistance and plastic deformation resistance.

Table 2 below shows permissible concentration ranges and best results ranges of the components of the finished cermet according to the present invention when yttrium oxide and/or aluminum oxide is used.

TABLE 2

| Component Used | Permissible | Percents by Weight For Best Results |
|---|---|---|
| (Ti, W) C,N or (Ti, W, M) C,N | about 10-65 | about 25-55 |
| MgO | about 0.01-1.0 | about 0.03-0.2 |
| Y₂O₃ and/or Al₂O₃ | about 0.5-10 | about 2-6 |
| W | The rest (about 24-89.49) | The rest (about 38.8-72.97) |

The tungsten cermet according to the present invention may contain not more than about 1% by weight of inevitable impurities such as Mo, Cr, Fe, Ni, Co and Re. Such impurities in an amount of not more than about 1 weight percent do not adversely affect the properties of the cermet according to the present invention.

In producing the cermet according to the present invention, powders of (Ti, W)C,N and/or (Ti, W, M)C,N, (Ti, W, M)C, nitrides of IVa and Va group metals, magnesium oxide, and tungsten are mixed, if needed, together with an aluminum oxide powder and/or yttrium oxide powder in predetermined compositions within the ranges mentioned above to produce a mixture, which is then wet mixed and dried in accordance with known prior art practices. Thereafter, it is pressed into a green compact, which is then sintered within a temperature range of from about 1800° C. to about 2700° C. in a vacuum or in an atmosphere of a nitrogen gas or an inert gas such as argon gas to produce a cermet with intended properties.

The cermet thus produced according to the present invention is machined into a tip or an insert blade, which may be coated in a well-known manner such as chemical vapor deposition or physical vapor deposition. The coating may include one layer composed of one of a carbide, nitride, carbonitride and oxycarbonitride of titanium, zirconium or hafnium or more than one layers composed of at least two of those substances. The coating may otherwise be one layer composed of one of an oxide and an oxynitride of aluminum or more than one layers of those substances. The tip or insert thus coated exhibits more excellent wear resistance when used in cutting tools for high speed cutting and heavy cutting of steel or cast iron since the cutting edge thereof is not subjected to plastic deformation at high temperatures during cutting, thus having high hardness and excellent chemical stability, and since the coating layer or layers are strongly adhered to the substrate. The average thickness of the coating is preferably within a range of about 0.5 to about 20 μm. With a coating of a thickness less than about 0.5 μm, sufficient wearing resistance cannot be obtained, and on the other hand with a coating of thickness larger than about 20 μm, the coated tool exhibits a large degradation in toughness.

The invention will be described in more detail with reference to the following examples, in which specific carbonitrides having a Va group metal or metals M', M" and M''' are represented as $(Ti_a, W_b, M'_c, M''_d, M'''_e)(C_x N_y)$ wherein a, b, c, d, e, x and y represent the atomic ratios respectively and wherein $a+b+c+d+e=1$ and $x+y=1$.

EXAMPLE 1

A complete solid solution $(Ti_{0.85}W_{0.15})(C_{0.70}N_{0.30})$ powder having an average particle size of 1.5 μm, a MgO powder having an average particle size of 0.4 μm, an Al₂O₃ powder having an average particle size of 0.5 μm, an Y₂O₃ powder having an average particle size of 0.4 μm and a tungsten powder of an average particle size of 0.8 μm were mixed in blend compositions set forth in TABLE 3 by a wet ball mill for 72 hours. After being dried each mixture was subjected to compacting at a pressure of 15 Kg/mm² to form a green compact, which was sintered in an atmosphere of nitrogen gas of 760 Torr at temperatures specified in TABLE 3 for two hours to produce each alloy of a composition also described in TABLE 3, in which the concentration of carbon in each finished cermet is given.

TABLE 3

| | | Blend Composition (wt. %) | | | | | Carbon Contained in Blend (wt. %) | Sintering Temperature (°C.) | Composition of Finished Cermet (wt. %) | | | | | Carbon Contained in Cermet (wt. %) |
|---|---|---|---|---|---|---|---|---|---|---|---|---|---|---|
| | | (Ti,W).C,N | MgO | Al$_2$O$_3$ | Y$_2$O$_3$ | W | | | (Ti,W).C,N | MgO | Al$_2$O$_3$ | Y$_2$O$_3$ | W | |
| Cermet | 1 | 40.0 | 0.5 | — | — | 59.5 | 4.11 | 2400 | 40.2 | 0.01 | — | — | 59.79 | 3.61 |
| of the | 2 | 42.5 | 1.0 | — | — | 56.5 | 4.36 | 2300 | 43.0 | 0.03 | — | — | 56.97 | 3.62 |
| Present | 3 | 45.0 | 1.5 | — | — | 53.5 | 4.62 | 2200 | 45.7 | 0.05 | — | — | 54.25 | 3.75 |
| Inven- | 4 | 47.5 | 2.0 | — | — | 50.5 | 4.88 | 2100 | 48.5 | 0.07 | — | — | 51.43 | 3.87 |
| tion | 5 | 50.0 | 2.5 | — | — | 47.5 | 5.13 | | 51.3 | 0.08 | — | — | 48.62 | 3.96 |
| | 6 | 50.0 | 3.0 | — | — | 47.0 | 5.13 | 2000 | 51.6 | 0.09 | — | — | 48.31 | 3.80 |
| | 7 | 52.5 | 3.5 | — | — | 44.0 | 5.39 | | 54.3 | 0.10 | — | — | 45.60 | 3.91 |
| | 8 | 55.0 | 4.0 | — | — | 41.0 | 5.65 | | 57.3 | 0.11 | — | — | 42.59 | 3.98 |
| | 9 | 57.5 | 4.5 | — | — | 38.0 | 5.90 | | 60.1 | 0.12 | — | — | 39.78 | 4.06 |
| | 10 | 60.0 | 5.0 | — | — | 35.0 | 6.16 | | 63.0 | 0.14 | — | — | 36.86 | 4.18 |
| | 11 | 40.0 | 0.5 | 1.0 | — | 58.5 | 4.11 | 2300 | 40.3 | 0.01 | 0.92 | — | 58.77 | 3.15 |
| | 12 | 42.5 | 1.0 | 1.0 | — | 55.5 | 4.36 | 2200 | 43.1 | 0.03 | 0.91 | — | 55.96 | 3.11 |
| | 13 | 45.0 | 1.0 | 2.0 | — | 52.0 | 4.62 | 2100 | 45.5 | 0.03 | 1.85 | — | 52.62 | 3.28 |
| | 14 | 45.0 | 1.0 | 3.0 | — | 51.0 | 4.62 | | 45.7 | 0.03 | 2.80 | — | 51.47 | 3.17 |
| | 15 | 45.0 | 1.0 | 1.5 | 1.5 | 51.0 | 4.62 | | 45.6 | 0.03 | 1.37 | 1.33 | 51.67 | 3.18 |
| | 16 | 47.5 | 1.5 | 2.0 | 1.0 | 48.0 | 4.88 | | 48.4 | 0.05 | 1.84 | 0.89 | 48.82 | 3.10 |
| | 17 | 52.5 | 2.0 | 3.0 | — | 42.5 | 5.39 | 2000 | 53.8 | 0.06 | 2.86 | — | 43.28 | 3.55 |
| | 18 | 55.0 | 3.0 | 3.0 | — | 39.0 | 5.65 | | 57.0 | 0.08 | 2.87 | — | 40.05 | 3.41 |
| | 19 | 57.5 | 4.0 | 3.0 | — | 35.5 | 5.90 | | 60.1 | 0.10 | 2.87 | — | 36.93 | 3.39 |
| | 20 | 60.0 | 5.0 | 3.0 | — | 32.0 | 6.16 | | 63.4 | 0.13 | 2.89 | — | 33.58 | 3.36 |
| | 21 | 50.0 | 2.0 | — | 1.0 | 47.0 | 5.13 | 2100 | 51.1 | 0.07 | — | 0.91 | 47.92 | 3.73 |
| | 22 | 50.0 | 2.0 | — | 2.0 | 46.0 | 5.13 | | 51.1 | 0.07 | — | 1.83 | 47.00 | 3.66 |
| | 23 | 50.0 | 2.0 | — | 3.0 | 45.0 | 5.13 | | 51.2 | 0.07 | — | 2.80 | 45.93 | 3.53 |
| | 24 | 50.0 | 3.0 | — | 3.0 | 44.0 | 5.13 | | 51.7 | 0.08 | — | 2.80 | 45.42 | 3.21 |
| Compara- | 1 | 40.0 | —*[1] | — | — | 60.0 | 4.11 | 2400 | 39.6 | —*[1] | — | — | 60.4 | 4.04 |
| tive | 2 | 65.0*[1] | 5.0 | — | — | 30.0 | 6.72 | 2000 | 68.4*[1] | 0.13 | — | — | 31.47 | 4.88 |
| Cermet | 2 | 65.0*[1] | 5.0 | 3.0 | — | 27.0 | 6.72 | | 68.7*[1] | 0.13 | 2.88 | — | 28.29 | 3.53 |

*[1] not fallen within the scope of the present invention.

Subsequently, the cermets thus obtained were tested as to Rockwell "A" hardness and transverse rupture strength (hereinafter referred to as T.R.S.), and formed into cutting tool inserts having a standard SNG 433 shape. The inserts were each attached to a holder and then subjected to a high speed continuous cutting test and an intermittent cutting test on the conditions indicated in TABLE 4. In the high speed continuous cutting test, flank wear width and crater wear depth of each tested insert were measured, and in the intermittent cutting test the number of largely chipped inserts out of ten inserts of the same composition was counted. The results are tabulated in TABLE 5. For comparison purposes, cemented tungsten carbide alloy inserts of P10 grade in ISO (hereinafter referred to as conventional inserts(1) and cutting inserts made of a cermet of TiC-10 wt. % Mo-15 wt. % Ni (hereinafter referred to as conventional inserts (2) were subjected to the above-mentioned cutting tests on the same conditions. The results are also set forth in TABLE 5.

TABLE 4

| | High speed continuous cutting test 1 | Intermittent cutting test 1 |
|---|---|---|
| Work material | AISI 4130 Brinell hardness H$_B$: 240 | AISI 4130 Brinell hardness H$_B$: 270 |
| Cutting speed (m/min.) | 200 | 120 |
| Feed (mm/rev.) | 0.3 | 0.4 |
| Depth of cut (mm) | 2 | 3 |
| Cutting time (min.) | 10 | 3 |

TABLE 5

| | | Hardness (H$_{RA}$) | T.R.S.*[2] (kg/mm$^2$) | High Speed Continuous Cutting | | Intermittent Cutting Number of Largely Chipped Tools/ Number of Tested Tools |
|---|---|---|---|---|---|---|
| | | | | Flank Wear Width (mm) | Crater Depth (μm) | |
| Cermet | 1 | 91.0 | 96 | 0.16 | 80 | 3/10 |
| of the | 2 | 91.0 | 107 | 0.18 | 80 | 2/10 |
| present | 3 | 4 | 115 | 0.20 | 80 | 1/10 |
| invention | 4 | 90.9 | 123 | 0.21 | 80 | 0/10 |
| | 5 | 90.9 | 125 | 0.21 | 75 | 0/10 |
| | 6 | 90.7 | 128 | 0.23 | 80 | 0/10 |
| | 7 | 90.7 | 121 | 0.23 | 80 | 1/10 |
| | 8 | 90.7 | 120 | 0.23 | 75 | 0/10 |
| | 9 | 90.6 | 115 | 0.24 | 80 | 1/10 |
| | 10 | 90.6 | 109 | 0.24 | 80 | 1/10 |
| | 11 | 91.3 | 94 | 0.16 | 80 | 3/10 |
| | 12 | 91.2 | 103 | 0.16 | 70 | 2/10 |
| | 13 | 91.2 | 114 | 0.14 | 40 | 2/10 |
| | 14 | 91.1 | 117 | 0.13 | 30 | 2/10 |
| | 15 | 91.1 | 113 | 0.16 | 40 | 1/10 |
| | 16 | 91.0 | 116 | 0.19 | 35 | 1/10 |
| | 17 | 91.0 | 126 | 0.14 | 30 | 0/10 |
| | 18 | 90.8 | 120 | 0.16 | 30 | 0/10 |

TABLE 5-continued

|  |  | Hardness ($H_RA$) | T.R.S.[*2] (kg/mm$^2$) | High Speed Continuous Cutting | | Intermittent Cutting Number of Largely Chipped Tools/ Number of Tested Tools |
|---|---|---|---|---|---|---|
|  |  |  |  | Flank Wear Width (mm) | Crater Depth ($\mu$m) |  |
|  | 19 | 90.8 | 116 | 0.18 | 40 | 0/10 |
|  | 20 | 90.7 | 110 | 0.20 | 50 | 0/10 |
|  | 21 | 90.9 | 115 | 0.18 | 75 | 2/10 |
|  | 22 | 90.8 | 119 | 0.17 | 50 | 1/10 |
|  | 23 | 90.7 | 119 | 0.16 | 45 | 1/10 |
|  | 24 | 90.6 | 120 | 0.20 | 45 | 1/10 |
| Compara- | 1 | 89.8 | 57 | 0.35 | 130 | 10/10 |
| tive | 2 | 89.5 | 72 | 0.30 | 80 | 8/10 |
| Cermet | 3 | 89.0 | 68 | 0.30 | 50 | 9/10 |
| Conven- | 1 | — | — | 0.55 | 155 | 9/10 |
| tional |  |  |  |  |  |  |
| Inserts | 2 | — | — | 0.43 | 95 | 10/10 |

[*2] T.R.S. stands for transverse rupture strength.

As clearly seen from TABLE 5, the cermets 1 to 24, produced according to the present invention, exhibited excellent properties in hardness and toughness and also exhibited excellent wear resistance and impact resistance in both the cutting tests. In contrast, with respect to the comparative cermet 1 free of MgO it was noted that in the intermittent cutting test large chippings were produced in all the tested inserts thereof due to inferior sintering property and impact resistance. With respect to the comparative alloys 2 and 3 which are larger in concentration of (Ti, W)C,N than the present invention, it was noted that although the inserts exhibited excellent wear resistance, in the intermittent cutting test large chippings were produced in most of them due to inferior toughness or impact resistance. Further, it was clearly noted that the conventional inserts 1 and 2 were inferior in both the wear resistance and impact resistance.

EXAMPLE 2

In addition to the powders as used in Example 1, a $(Ti_{0.75}W_{0.25})(C_{0.80}N_{0.20})$ powder having an average particle size of 1.5 $\mu$m, a $(Ti_{0.70}W_{0.30})(C_{0.70}N_{0.30})$ powder having an average particle size of 1.8 $\mu$m and a $(Ti_{0.80}W_{0.20})(C_{0.60}N_{0.40})$ powder having an average particle size of 2.0 $\mu$m were prepared, all the carbonitrides being in complete solid solution, and on the same conditions as in Example 1 these powders were mixed in blend compositions shown in TABLE 6 and then pressed to form green compacts, which were each sintered in the atmosphere shown in TABLE 6 at a temperature of of 2000° C. for two hours to thereby produce each of cermets 25–46 covered by the appended claims, which had a composition given in TABLE 6.

TABLE 6

Cermet of the Present Invention (Rows 25–35)

| No. | (Ti,W)C,N Ti:0.75 W:0.25 C:0.80 N:0.20 | (Ti,W)C,N Ti:0.85 W:0.15 C:0.70 N:0.30 | (Ti,W)C,N Ti:0.70 W:0.30 C:0.70 N:0.30 | (Ti,W)C,N Ti:0.80 W:0.20 C:0.60 N:0.40 | MgO | Al$_2$O$_3$ | W | Carbon in Blend (wt.%) | S.A.*3 P. Torr | (Ti,W)C,N Ti:0.75 W:0.25 C:0.80 N:0.20 | (Ti,W)C,N Ti:0.85 W:0.15 C:0.70 N:0.30 | (Ti,W)C,N Ti:0.70 W:0.30 C:0.70 N:0.30 | (Ti,W)C,N Ti:0.80 W:0.20 C:0.60 N:0.40 | MgO | Al$_2$O$_3$ | W | Carbon in Cermet (wt.%) |
|---|---|---|---|---|---|---|---|---|---|---|---|---|---|---|---|---|---|
| 25 | 40.0 | — | — | — | 3.0 | — | 57.0 | 4.07 | 300 | 41.2 | — | — | — | 0.09 | — | 58.71 | 2.75 |
| 26 | — | 35.0 | — | — | 3.0 | — | 62.0 | 3.59 | 400 | — | 36.1 | — | — | 0.09 | — | 63.81 | 2.27 |
| 27 | — | — | 40.0 | — | 3.0 | — | 57.0 | 3.29 | 500 | — | — | 41.1 | — | 0.09 | — | 58.81 | 1.97 |
| 28 | — | — | — | 35.0 | 2.0 | — | 63.0 | 2.87 | 600 | — | — | — | 35.7 | 0.07 | — | 64.23 | 1.88 |
| 29 | 20.0 | — | — | 17.5 | 3.0 | — | 59.5 | 3.47 | 400 | 20.6 | — | — | 18.0 | 0.09 | — | 61.31 | 2.15 |
| 30 | — | 17.5 | 20.0 | — | 3.0 | — | 59.5 | 3.44 | | — | 18.0 | 20.6 | — | 0.09 | — | 61.31 | 2.11 |
| 31 | 35.0 | — | — | — | 2.5 | — | 62.5 | 3.56 | 400 (Ar gas) | 35.9 | — | — | — | 0.08 | — | 64.02 | 2.40 |
| 32 | — | 30.0 | — | — | 2.5 | — | 67.5 | 3.08 | | — | 30.8 | — | — | 0.08 | — | 69.12 | 1.92 |
| 33 | — | — | 35.0 | — | 2.5 | — | 62.5 | 2.88 | | — | — | 35.9 | — | 0.08 | — | 64.02 | 1.72 |
| 34 | — | — | — | 30.0 | 2.0 | — | 68.0 | 2.46 | | — | — | — | 30.6 | 0.07 | — | 69.33 | 1.46 |
| 35 | 17.5 | — | — | 15.0 | 2.5 | — | 65.0 | 3.01 | 10$^{-2}$ (vacuum) | 17.9 | — | — | 15.4 | 0.08 | — | 66.62 | 1.85 |

Cermet of the Present Invention (Rows 36–46)

| No. | (Ti$_a$,W$_b$)C$_x$N$_y$ a:0.75 b:0.25 x:0.80 y:0.20 | a:0.85 b:0.15 x:0.70 y:0.30 | a:0.70 b:0.30 x:0.70 y:0.30 | a:0.80 b:0.20 x:0.60 y:0.40 | MgO | Al$_2$O$_3$ | W | Carbon in Blend (wt.%) | S.A.*3 P. Torr | a:0.75 b:0.25 x:0.80 y:0.20 | a:0.85 b:0.15 x:0.70 y:0.30 | a:0.70 b:0.30 x:0.70 y:0.30 | a:0.80 b:0.20 x:0.60 y:0.40 | MgO | Al$_2$O$_3$ | W | Carbon in Cermet (wt.%) |
|---|---|---|---|---|---|---|---|---|---|---|---|---|---|---|---|---|---|
| 36 | 37.5 | — | — | — | 3.0 | 3.0 | 56.5 | 3.82 | 300 | 38.8 | — | — | — | 0.09 | 2.82 | 58.29 | 1.70 |
| 37 | — | 30.0 | — | — | 2.0 | 3.0 | 65.0 | 3.08 | 400 | — | 30.7 | — | — | 0.07 | 2.85 | 66.38 | 1.28 |
| 38 | — | — | 37.5 | — | 2.0 | 3.0 | 57.5 | 3.08 | 500 | — | — | 38.4 | — | 0.07 | 2.82 | 58.71 | 1.27 |
| 39 | — | — | — | 35.0 | 1.5 | 3.0 | 60.5 | 2.87 | 600 | — | — | — | 35.6 | 0.05 | 2.83 | 61.52 | 1.22 |
| 40 | 20.0 | — | — | 15.0 | 2.0 | 3.0 | 60.0 | 3.27 | 400 | 20.5 | — | — | 15.3 | 0.07 | 2.83 | 61.3 | 1.45 |
| 41 | — | 15.0 | 20.0 | — | 1.0 | 3.0 | 61.0 | 3.18 | | — | 15.2 | 20.3 | — | 0.03 | 2.83 | 61.64 | 1.63 |
| 42 | 32.5 | — | — | — | 2.0 | 3.0 | 62.5 | 3.31 | 400 (Ar gas) | 33.2 | — | — | — | 0.07 | 2.85 | 63.88 | 1.56 |
| 43 | — | 27.5 | — | — | 2.0 | 2.0 | 68.5 | 2.82 | | — | 28.1 | — | — | 0.07 | 1.87 | 69.96 | 1.20 |
| 44 | — | — | 32.5 | — | 1.5 | 3.0 | 63.0 | 2.67 | | — | — | 33.1 | — | 0.05 | 2.86 | 63.99 | 1.10 |
| 45 | — | — | — | 30.0 | 1.0 | 3.5 | 65.5 | 2.46 | | — | — | — | 30.5 | 0.03 | 3.31 | 66.16 | 1.01 |
| 46 | 17.5 | — | 15.0 | — | 1.5 | 3.5 | 62.5 | 3.01 | 10$^{-2}$ (vacuum) | 17.9 | — | 15.3 | — | 0.05 | 3.31 | 63.44 | 1.44 |

The cermets thus obtained were each subjected to the Rockwell "A" hardness test and the T.R.S. test, and formed into cutting tool inserts having a standard SNG 433 shaped. The inserts were each attached to a holder and then subjected to a continuous cutting test 2 with a high feed per revolution and an intermittent cutting test 2 on the conditions given in TABLE 7. The results are set forth in TABLE 8. Furthermore, cemented tungsten carbide cutting inserts of ISO P30 grade (conventional insert 3) were subjected to the same tests, the results of which are also tabulated in TABLE 8.

TABLE 7

|  | High feed continuous cutting test 2 | Intermittent cutting test 2 |
|---|---|---|
| Work material | AISI 4130 Brinell hardness $H_B$: 260 | AISI 4130 Brinell hardness $H_B$: 270 |
| Cutting speed (m/min.) | 100 | 100 |
| Feed (mm/rev.) | 0.8 | 0.45 |
| Depth of cut (mm) | 4 | 3 |
| Cutting time (min.) | 10 | 3 |

It is clear from TABLE 8 that all the cermets according to the present invention had high hardness and high toughness, and exhibited excellent cutting performances in both the high feed continuous cutting test 2 and the intermittent cutting test 2. On the other hand, the conventional inserts 3 could not perform cutting in three minutes in the continuous cutting test 2 due to inferior plastic deformation resistance.

Example 1, there were prepared a powder of complete solid solution $(Ti_{0.80}W_{0.20})(C_{0.70}N_{0.30})$ of 1.5 μm average particle size, a molybdenum powder of 0.8 μm average particle size, a nickel powder of 2.5 μm average particle size, cobalt powder of 1.2 μm average particle size and a rhenium powder of 3.0 μm average particle size. These powders were mixed in compositions given in TABLE 9, dried and pressed on the same conditions as in the Example 1 to form compacts, which were then each sintered under an atmosphere of nitrogen gas of 300 Torr at a temperature shown in TABLE 9 for two hours to thereby produce each of cermets 47–67 of the present invention and comparative cermets 4–11.

These cermets were subjected to the same tests as in Example 2 except that the continuous cutting test and the intermittent cutting test were conducted on the conditions given in TABLE 10. The results are tabulated in TABLE 11.

On the other hand, conventional inserts 4 made of a cemented tungsten carbide alloy of ISO P40 grade were prepared and subjected to the same cutting tests as in Example 3 for comparison purposes, of which results are also shown in TABLE 11.

From TABLE 11 it is clear that the cermets 47–67 according to the present invention were excellent in hardness and toughness and exhibited excellent cutting performances in both the continuous cutting test and the intermittent cutting test. Further, the cermets 54–57 and 63–66 show that any concentration of not larger than about 1% of impurities such as Mo, Ni, Co and Re did not adversely affect the properties of the cermets of the present invention.

TABLE 8

|  |  | Hardness ($H_RA$) | T.R.S.*2 (kg/mm$^2$) | High Feed Continuous Cutting | | Intermittent Cutting Number of Largely Chipped Tools/ Number of Tested Tools |
|---|---|---|---|---|---|---|
|  |  |  |  | Flank Wear Width (mm) | Crater Depth (μm) |  |
| Cermet of the present invention | 25 | 89.5 | 129 | 0.19 | 65 | 2/10 |
|  | 26 | 89.4 | 130 | 0.17 | 55 | 0/10 |
|  | 27 | 89.3 | 131 | 0.20 | 55 | 0/10 |
|  | 28 | 89.1 | 125 | 0.24 | 40 | 1/10 |
|  | 29 | 89.3 | 127 | 0.22 | 50 | 1/10 |
|  | 30 | 89.3 | 130 | 0.18 | 55 | 0/10 |
|  | 31 | 89.6 | 128 | 0.18 | 65 | 2/10 |
|  | 32 | 89.5 | 129 | 0.17 | 60 | 0/10 |
|  | 33 | 89.4 | 130 | 0.18 | 55 | 0/10 |
|  | 34 | 89.2 | 122 | 0.20 | 45 | 1/10 |
|  | 35 | 89.5 | 125 | 0.20 | 55 | 1/10 |
|  | 36 | 90.0 | 125 | 0.16 | 30 | 2/10 |
|  | 37 | 89.9 | 129 | 0.15 | 20 | 0/10 |
|  | 38 | 89.8 | 130 | 0.17 | 25 | 0/10 |
|  | 39 | 89.6 | 123 | 0.19 | 20 | 1/10 |
|  | 40 | 89.8 | 124 | 0.18 | 25 | 1/10 |
|  | 41 | 89.8 | 129 | 0.16 | 25 | 2/10 |
|  | 42 | 90.0 | 123 | 0.16 | 35 | 2/10 |
|  | 43 | 89.6 | 130 | 0.17 | 30 | 0/10 |
|  | 44 | 89.7 | 126 | 0.18 | 35 | 1/10 |
|  | 45 | 89.6 | 120 | 0.19 | 30 | 2/10 |
|  | 46 | 89.8 | 125 | 0.17 | 35 | 1/10 |
| Conventional Inserts | 3 | — | — | Plastic Deformation in 3 min. |  | 3/10 |

EXAMPLE 3

In addition to the MgO powder, the $Y_2O_3$ powder, the $Al_2O_3$ powder and the tungsten powder as used in

TABLE 9

| Blend Composition (wt. %) | | Carbon Contained in Blend | Sintering Temperature | Composition of Resulting Cermet (wt. %) | | Carbon Contained in Cermet |
|---|---|---|---|---|---|---|
| (Ti,W). | Im- |  |  | (Ti,W) | Impur- |  |

TABLE 9-continued

| | | Blend Composition (wt. %) | | | | | Carbon Contained in Blend (wt. %) | S.T.*5 (°C.) | Composition of Finished Cermet | | | | | Carbon Contained in Cermet (wt. %) |
|---|---|---|---|---|---|---|---|---|---|---|---|---|---|---|
| | | (Ti,W).C,N | MgO | Al$_2$O$_3$ | W | Impurity | | | (Ti,W).C,N | MgO | Al$_2$O$_3$ | W | Impurity | |
| Cermet of the Present Invention | 47 | 40.0 | 9.0 | — | 51.0 | — | 3.84 | 2000 | 43.9 | 0.25 | — | 55.85 | — | 0.46 |
| | 48 | 35.0 | 7.0 | — | 58.0 | — | 3.36 | | 37.6 | 0.19 | — | 62.21 | — | 0.73 |
| | 49 | 30.0 | 5.0 | — | 65.0 | — | 2.88 | | 31.4 | 0.15 | — | 68.45 | — | 1.00 |
| | 50 | 25.0 | 3.0 | — | 72.0 | — | 2.40 | | 25.7 | 0.10 | — | 74.2 | — | 1.08 |
| | 51 | 20.0 | 2.0 | — | 78.0 | — | 1.92 | 2200 | 20.4 | 0.07 | — | 79.53 | — | 0.92 |
| | 52 | 15.0 | 2.0 | — | 83.0 | — | 1.44 | | 15.3 | 0.08 | — | 84.62 | — | 0.49 |
| | 53 | 10.0 | 2.0 | — | 88.0 | — | 0.96 | | 10.2 | 0.08 | — | 89.72 | — | 0.40 |
| | 54 | 25.0 | 3.0 | — | 71.0 | Mo: 1.0 | 2.40 | 2000 | 25.8 | 0.10 | — | 73.1 | Mo: 1.0 | 1.09 |
| | 55 | 25.0 | 3.0 | — | 71.0 | Ni: 1.0 | 2.40 | | 25.8 | 0.10 | — | 73.5 | Ni: 0.6 | 1.08 |
| | 56 | 25.0 | 3.0 | — | 71.0 | Co: 1.0 | 2.40 | | 25.8 | 0.10 | — | 73.6 | Co: 0.5 | 1.08 |
| | 57 | 25.0 | 3.0 | — | 71.0 | Re: 1.0 | 2.40 | | 25.8 | 0.10 | — | 73.1 | Re: 1.0 | 1.07 |
| | 58 | 30.0 | 2.0 | 5.0 | 63.0 | — | 2.88 | | 30.7 | 0.07 | 4.72 | 64.51 | — | 0.88 |
| | 59 | 25.0 | 2.0 | 5.0 | 68.0 | — | 2.40 | | 25.6 | 0.07 | 4.74 | 69.59 | — | 0.47 |
| | 60 | 20.0 | 1.0 | 7.0 | 72.0 | — | 1.92 | 2200 | 20.3 | 0.04 | 6.65 | 73.01 | — | 0.30 |
| Cermet of the present Invention | 61 | 15.0 | 1.0 | 7.0 | 77.0 | — | 1.44 | 2200 | 15.2 | 0.04 | 6.70 | 78.06 | — | 0.28 |
| | 62 | 10.0 | 1.0 | 9.0 | 80.0 | — | 0.96 | | 10.2 | 0.04 | 8.51 | 81.25 | — | 0.25 |
| | 63 | 25.0 | 2.0 | 5.0 | 67.0 | Mo: 1.0 | 2.40 | 2000 | 25.6 | 0.07 | 4.73 | 68.7 | Mo: 0.9 | 0.48 |
| | 64 | 25.0 | 2.0 | 5.0 | 67.0 | Ni: 1.0 | 2.40 | | 25.6 | 0.07 | 4.70 | 69.13 | Ni: 0.5 | 0.46 |
| | 65 | 25.0 | 2.0 | 5.0 | 67.0 | Co: 1.0 | 2.40 | | 25.6 | 0.07 | 4.70 | 69.23 | Co: 0.4 | 0.46 |
| | 66 | 25.0 | 2.0 | 5.0 | 67.0 | Re: 1.0 | 2.40 | | 25.6 | 0.07 | 4.73 | 68.6 | Re: 1.0 | 0.48 |
| | 67 | 40.0 | 10.0 | 3.0 | 47.0 | — | 3.84 | 1800 | 44.0 | 0.92 | 2.87 | 52.21 | — | 1.25 |
| Comparative Cermet | 4 | 40.0 | 11.0*4 | — | 49.0 | — | 3.84 | 2000 | 44.8 | 0.39 | — | 54.81 | — | 0.12 |
| | 5 | 30.0 | 15.0*4 | 5.0 | 50.0 | — | 2.88 | 1800 | 35.3 | 1.05*4 | 4.82 | 58.83 | — | 0.35 |
| | 6 | 7.0*4 | 2.0 | — | 91.0 | — | 0.67 | 2200 | 7.1*4 | 0.08 | — | 92.82 | — | 0.35 |
| | 7 | 7.0*4 | 2.0 | 7.0 | 84.0 | — | 0.67 | | 7.1*4 | 0.08 | 6.83 | 85.99 | — | 0.22 |
| | 8 | 25.0 | 3.0 | — | 69.0 | Ni: 3.0*4 | 2.40 | 1800 | 25.8 | 0.10 | — | 71.6 | Ni: 2.5*4 | 1.28 |
| | 9 | 25.0 | 2.0 | 5.0 | 65.0 | Ni: 3.0*4 | 2.40 | | 25.6 | 0.07 | 4.70 | 67.13 | Ni: 2.5*4 | 0.79 |
| | 10 | 30.0 | 5.0 | — | 65.0 | — | 2.88 | 1700*4 | 31.3 | 1.08*4 | — | 67.62 | — | 2.18 |
| | 11 | 25.0 | 5.0 | 2.0 | 68.0 | — | 2.40 | | 26.1 | 1.10*4 | 1.93 | 70.87 | — | 1.69 |

*4 not fallen within the scope of the present invention.
*5 S.T. stands for sintering temperature.

In contrast, poor cutting performances and the lack of toughness were noted in the comparative cermets 4 and 5 containing MgO beyond the upper limit concentration recited in the appended claims, the comparative cermets 6 and 7 containing (Ti, W)C,N below the lower limit concentration defined in the appended claims, the comparative cermets 8 and 9 containing more than about 1% by weight of nickel as an impurity, and the comparative cermets 10–11 sintered at temperatures below the lower limit of the present invention. With respect to the conventional insert 4, it was noted that in the continuous cutting test it was unable to cut the work in 1 min. due to inferior plastic deformation resistance although it was equal in toughness or impact resistance to the cermets 46–67 according to the present invention.

TABLE 10

| | High feed continuous cutting test 3 | Intermittent cutting test 2 |
|---|---|---|
| Work material | AISI 4130 Brinell hardness H$_B$: 260 | AISI 4130 Brinell hardness H$_B$: 270 |
| Cutting speed (m/min.) | 60 | 80 |
| Feed (mm/rev.) | 0.7 | 0.5 |
| Depth of cut (mm) | 10 | 3 |
| Cutting time (min.) | 3 | 3 |

TABLE 11

| | | Hardness (H$_R$A) | T.R.S.*2 (kg/mm$^2$) | High Feed Continuous Cutting | | Intermittent Cutting Number of Largely Chipped Tools/ Number of Tested Tools |
|---|---|---|---|---|---|---|
| | | | | Flank Wear Width (mm) | Crater Depth (μm) | |
| Cermet of the present invention | 47 | 87.5 | 102 | 0.25 | 60 | 3/10 |
| | 48 | 87.9 | 115 | 0.23 | 55 | 2/10 |
| | 49 | 88.2 | 118 | 0.22 | 55 | 1/10 |
| | 50 | 88.5 | 133 | 0.20 | 55 | 0/10 |
| | 51 | 88.0 | 130 | 0.23 | 60 | 0/10 |
| | 52 | 87.5 | 120 | 0.25 | 65 | 1/10 |
| | 53 | 87.0 | 114 | 0.29 | 80 | 2/10 |
| | 54 | 88.0 | 126 | 0.24 | 60 | 1/10 |
| | 55 | 87.7 | 124 | 0.26 | 70 | 1/10 |
| | 56 | 87.6 | 122 | 0.28 | 70 | 1/10 |
| | 57 | 88.0 | 125 | 0.24 | 65 | 1/10 |
| | 58 | 88.7 | 121 | 0.15 | 30 | 1/10 |
| | 59 | 88.5 | 120 | 0.17 | 30 | 1/10 |
| | 60 | 88.4 | 116 | 0.18 | 30 | 2/10 |
| | 61 | 88.2 | 103 | 0.20 | 30 | 2/10 |
| | 62 | 87.7 | 98 | 0.25 | 35 | 3/10 |

TABLE 11-continued

|  |  | Hardness (H$_R$A) | T.R.S.*2 (kg/mm$^2$) | High Feed Continuous Cutting | | Intermittent Cutting Number of Largely Chipped Tools/ Number of Tested Tools |
|---|---|---|---|---|---|---|
|  |  |  |  | Flank Wear Width (mm) | Crater Depth ($\mu$m) |  |
|  | 63 | 88.4 | 110 | 0.20 | 45 | 2/10 |
|  | 64 | 88.1 | 112 | 0.21 | 50 | 2/10 |
|  | 65 | 88.1 | 112 | 0.21 | 50 | 2/10 |
|  | 66 | 88.3 | 115 | 0.19 | 40 | 2/10 |
|  | 67 | 87.2 | 87 | 0.31 | 80 | 4/10 |
| Comparative Cermet | 4 | 86.7 | 74 | Plastic Deformation in 1.5 min. | | 6/10 |
|  | 5 | 86.7 | 55 | Plastic Deformation in 1.1 min. | | 9/10 |
|  | 6 | 86.2 | 57 | Plastic Deformation in 0.7 min. | | 7/10 |
|  | 7 | 86.9 | 62 | Plastic Deformation in 0.8 min. | | 8/10 |
|  | 8 | 86.8 | 65 | Plastic Deformation in 0.8 min. | | 8/10 |
|  | 9 | 86.9 | 50 | Plastic Deformation in 0.7 min. | | 10/10 |
|  | 10 | 86.0 | 44 | Plastic Deformation in 0.4 min. | | 10/10 |
|  | 11 | 86.0 | 43 | Large Chipping in 0.5 min. | | 10/10 |
| Conventional Inserts | 4 | — | — | Plastic Deformation in 1.0 min. | | 2/10 |

EXAMPLE 4

There were prepared the same powders as in Example 1 except a complete solid solution (Ti$_{0.75}$W$_{0.15}$Ta$_{0.10}$)(C$_{0.70}$N$_{0.30}$) powder of a 1.5 $\mu$m average particle size was used in place of the (Ti$_{0.85}$W$_{0.15}$)(C$_{0.70}$N$_{0.30}$) powder. These powders were processed in blend compositions given in TABLE 12 in the same manner as in Example 1 to produce cermets 101–124 covered by the present invention and comparative cermets 11–13. The compositions of the finished cermets are also set forth in TABLE 12.

The cermets 101–124 according to the present invention and the comparative cermets 11–13 were subjected to the same hardness test and the T.R.S. test as in Example 1, and machined into cutting tool inserts of a SNG 433 shape, which were subjected to the high speed cutting test 1 and the intermittent cutting test 1 defined in TABLE 4. The results are given in TABLE 13.

For comparison purposes, the conventional inserts 1 and the conventional inserts 2 as defined in Example 1 were subjected to the above-described tests, the results of which are also given in TABLE 13.

It is seen from TABLE 13 that the cermets 101–124 according to the present invention were excellent in hardness and toughness and exhibited excellent wear resistance and impact resistance in both the cutting tests. In the comparative cermet 11 which does not contain MgO, all the inserts made of it were subjected to large chipping at their edges due to their inferior properties caused by sintering and inferior impact resistance. With respect to the comparative cermets 12 and 13, which contain (Ti, W, Ta)C,N beyond the upper limit concentration of the present invention, large chippings were produced in most of their inserts in the intermittent cutting test due to inferior toughness although their inserts exhibited relatively excellent wear resistance.

TABLE 12

|  |  | Blend Composition (wt. %) | | | | | Carbon Contained in Blend (wt. %) | Sintering Temperature (°C.) | Composition of Resulting Cermet (wt. %) | | | | | Carbon Contained in Cermet (wt. %) |
|---|---|---|---|---|---|---|---|---|---|---|---|---|---|---|
|  |  | (Ti,W,Ta)C,N | MgO | Al$_2$O$_3$ | Y$_2$O$_3$ | W |  |  | (Ti,W,Ta)C,N | MgO | Al$_2$O$_3$ | Y$_2$O$_3$ | W |  |
| Cermet of the Present Invention | 101 | 40.0 | 0.5 | — | — | 59.5 | 3.61 | 2400 | 40.2 | 0.01 | — | — | 59.79 | 3.11 |
|  | 102 | 42.5 | 1.0 | — | — | 56.5 | 3.83 | 2300 | 43.0 | 0.03 | — | — | 56.97 | 3.08 |
|  | 103 | 45.0 | 1.5 | — | — | 53.5 | 4.06 | 2200 | 45.7 | 0.05 | — | — | 54.25 | 3.19 |
|  | 104 | 47.5 | 2.0 | — | — | 50.5 | 4.28 | 2100 | 48.4 | 0.07 | — | — | 51.53 | 3.28 |
|  | 105 | 50.0 | 2.5 | — | — | 47.5 | 4.51 |  | 51.3 | 0.08 | — | — | 48.62 | 3.33 |
|  | 106 | 52.5 | 3.0 | — | — | 44.5 | 4.74 | 2000 | 54.2 | 0.09 | — | — | 45.71 | 3.40 |
|  | 107 | 55.0 | 3.5 | — | — | 41.5 | 4.96 |  | 57.2 | 0.10 | — | — | 42.7 | 3.54 |
|  | 108 | 57.5 | 4.0 | — | — | 38.5 | 5.19 |  | 60.0 | 0.11 | — | — | 39.89 | 3.58 |
|  | 109 | 60.0 | 4.5 | — | — | 35.5 | 5.41 |  | 62.9 | 0.13 | — | — | 36.97 | 3.65 |
|  | 110 | 40.0 | 0.5 | 1.0 | — | 58.5 | 3.61 | 2300 | 40.3 | 0.01 | 0.93 | — | 58.76 | 2.81 |
|  | 111 | 42.5 | 1.0 | 1.0 | — | 55.5 | 3.83 | 2200 | 43.1 | 0.03 | 0.92 | — | 55.95 | 2.78 |
|  | 112 | 45.0 | 1.0 | 2.0 | — | 52.0 | 4.06 | 2100 | 45.8 | 0.03 | 1.86 | — | 52.31 | 2.91 |
|  | 113 | 45.0 | 1.0 | 3.0 | — | 51.0 | 4.06 |  | 45.9 | 0.03 | 2.82 | — | 51.25 | 2.81 |
|  | 114 | 45.0 | 1.0 | 1.5 | 1.5 | 51.0 | 4.06 |  | 45.9 | 0.03 | 1.38 | 1.35 | 51.34 | 2.85 |
|  | 115 | 47.5 | 1.5 | 2.5 | — | 48.5 | 4.28 | 2100 | 48.5 | 0.05 | 2.36 | — | 49.09 | 2.96 |
|  | 116 | 50.0 | 2.0 | 2.5 | — | 45.5 | 4.51 | 2000 | 51.4 | 0.07 | 2.36 | — | 46.17 | 3.06 |
|  | 117 | 52.5 | 2.5 | 2.5 | — | 42.5 | 4.74 |  | 54.3 | 0.08 | 2.36 | — | 43.26 | 3.13 |
|  | 118 | 55.0 | 3.0 | 3.0 | — | 39.0 | 4.96 |  | 57.3 | 0.09 | 2.82 | — | 39.79 | 3.14 |
|  | 119 | 57.5 | 3.5 | 3.0 | — | 36.0 | 5.19 |  | 60.1 | 0.10 | 2.82 | — | 36.98 | 3.28 |

TABLE 12-continued

| | | Blend Composition (wt. %) | | | | | Carbon Contained in Blend (wt. %) | Sintering Temperature (°C.) | Composition of Resulting Cermet (wt. %) | | | | | Carbon Contained in Cermet (wt. %) |
|---|---|---|---|---|---|---|---|---|---|---|---|---|---|---|
| | | (Ti,W,Ta)C,N | MgO | Al$_2$O$_3$ | Y$_2$O$_3$ | W | | | (Ti,W,Ta)C,N | MgO | Al$_2$O$_3$ | Y$_2$O$_3$ | W | |
| | 120 | 60.0 | 4.0 | 3.0 | — | 33.0 | 5.41 | | 63.0 | 0.11 | 2.83 | — | 34.06 | 3.31 |
| | 121 | 50.0 | 2.0 | — | 1.5 | 46.5 | 4.51 | | 51.5 | 0.07 | — | 1.36 | 47.07 | 3.21 |
| | 122 | 50.0 | 2.0 | — | 2.0 | 46.0 | 4.51 | | 51.5 | 0.07 | — | 1.85 | 46.58 | 3.20 |
| | 123 | 50.0 | 2.0 | — | 2.5 | 45.5 | 4.51 | | 51.5 | 0.07 | — | 2.33 | 46.1 | 3.16 |
| | 124 | 50.0 | 2.0 | — | 3.0 | 45.0 | 4.51 | | 51.5 | 0.07 | — | 2.80 | 45.63 | 3.11 |
| Comparative Cermet | 11 | 40.0 | —*5 | — | — | 60.0 | 3.61 | 2400 | 39.8 | — | — | — | 60.2 | 3.54 |
| | 12 | 65.5*5 | 4.5 | — | — | 30.0 | 5.86 | 2000 | 68.2*5 | — | — | — | 31.8 | 4.12 |
| | 13 | 65.5*5 | 4.5 | 3.0 | — | 27.0 | 5.86 | | 68.6*5 | 0.09 | 2.83 | — | 28.48 | 3.76 |

*5 not fallen within the scope of the present invention.

TABLE 13

| | | Hardness (H$_R$A) | T.R.S.*2 (kg/mm$^2$) | High Speed Continuous Cutting | | Intermittent Cutting Number of Largely Chipped Tools/ Number of Tested Tools |
|---|---|---|---|---|---|---|
| | | | | Flank Wear Width (mm) | Crater Depth (μm) | |
| Cermet of the present invention | 101 | 90.9 | 99 | 0.15 | 80 | 3/10 |
| | 102 | 90.9 | 108 | 0.17 | 80 | 2/10 |
| | 103 | 90.9 | 117 | 0.19 | 75 | 0/10 |
| | 104 | 90.8 | 125 | 0.20 | 75 | 0/10 |
| | 105 | 90.8 | 127 | 0.20 | 75 | 0/10 |
| | 106 | 90.7 | 130 | 0.21 | 75 | 0/10 |
| | 107 | 90.6 | 124 | 0.22 | 75 | 0/10 |
| | 108 | 90.6 | 116 | 0.23 | 80 | 1/10 |
| | 109 | 90.6 | 105 | 0.23 | 80 | 1/10 |
| | 110 | 91.0 | 95 | 0.15 | 70 | 3/10 |
| | 111 | 91.0 | 104 | 0.16 | 60 | 2/10 |
| | 112 | 91.0 | 113 | 0.14 | 40 | 1/10 |
| | 113 | 90.9 | 115 | 0.13 | 30 | 2/10 |
| | 114 | 90.8 | 116 | 0.15 | 40 | 1/10 |
| | 115 | 90.9 | 118 | 0.14 | 35 | 0/10 |
| | 116 | 90.9 | 120 | 0.15 | 35 | 0/10 |
| | 117 | 90.8 | 122 | 0.15 | 35 | 0/10 |
| | 118 | 90.7 | 119 | 0.14 | 30 | 1/10 |
| | 119 | 90.7 | 110 | 0.15 | 30 | 1/10 |
| | 120 | 90.7 | 102 | 0.17 | 30 | 2/10 |
| | 121 | 90.9 | 117 | 0.18 | 65 | 1/10 |
| | 122 | 90.9 | 119 | 0.17 | 55 | 0/10 |
| | 123 | 90.8 | 121 | 0.17 | 45 | 1/10 |
| | 124 | 90.7 | 118 | 0.16 | 40 | 2/10 |
| Comparative Cermet | 11 | 89.7 | 58 | 0.36 | 135 | 10/10 |
| | 12 | 89.5 | 70 | 0.31 | 85 | 8/10 |
| | 13 | 89.1 | 68 | 0.30 | 55 | 9/10 |
| Conventional Inserts | 1 | — | — | 0.56 | 160 | 9/10 |
| | 2 | — | — | 0.45 | 100 | 10/10 |

It was further noted that the conventional inserts 1 and 2 were inferior in wear resistance and impact resistance, and that they exhibited poor cutting performances.

EXAMPLE 5

In addition to the powders as used in Example 4, there were prepared a TiN powder of 1.2 μm average particle size, a VN powder of 1.6 μm average particle size, a NbN powder of 1.8 μm average particle size, a TaN powder of 1.5 μm average particle size, a (Ti$_{0.65}$W$_{0.25}$Ta$_{0.10}$)(C$_{0.80}$N$_{0.20}$) powder of 1.5 μm average particle size, a (Ti$_{0.75}$W$_{0.15}$V$_{0.10}$)(C$_{0.70}$N$_{0.30}$) powder of 1.8 μm average particle size, a (T$_{0.75}$W$_{0.15}$Nb$_{0.10}$)(C$_{0.70}$N$_{0.30}$) powder of 1.5 μm average particle size and a (Ti$_{0.75}$W$_{0.15}$Ta$_{0.10}$)C$_{1.0}$ powder of 2.0 μm average particle size, all those carbonitrides being in complete solid solution. These powders were matched in compositions set forth in TABLE 14, and then processed in the same manner as in Example 1 to form compacts, which were sintered in atmospheres indicated in TABLE 14 at 2000° C. for two hours to produce cermets 125-142 according to the present invention having compositions given in TABLE 15.

The cermets 125-142 and the conventional inserts 3 as defined in Example 2 were subjected to the same tests as in Example 2 on the same conditions.

The results of the tests are set forth in TABLE 16, from which it is seen that the cermets 125-142 according to the present invention had excellent hardness and toughness and exhibited excellent cutting performances in both the continuous cutting test and the intermittent cutting test.

TABLE 14

| | | Blend Composition (wt. %) | | | | | | | | | | |
|---|---|---|---|---|---|---|---|---|---|---|---|---|
| | | (Ti,W,Va group metal)CN (atomic ratio) | | | | | | | | | | |
| | | Ti: 0.65 W: 0.25 Ta: 0.10 C: 0.80 N: 0.20 | Ti: 0.75 W: 0.15 V: 0.10 C: 0.70 N: 0.30 | Ti: 0.75 W: 0.15 Nb: 0.10 C: 0.70 N: 0.30 | Ti: 0.75 W: 0.15 Ta: 0.10 C: 0.70 N: 0.30 | Ti: 0.75 W: 0.15 Ta: 0.10 C: 1.0 N: — | Nitride | MgO | $Al_2O_3$ | W | Carbon Contained in Blend (wt. %) | Sintering [3] Atmosphere Pressure (Torr) |
| Cermet of the Present Invention | 125 | 40.0 | — | — | — | — | — | 2.0 | — | 58.0 | 3.60 | 300 |
| | 126 | — | 37.5 | — | — | — | — | 2.0 | — | 60.5 | 3.92 | 400 |
| | 127 | — | — | 37.5 | — | — | — | 2.0 | — | 60.5 | 3.65 | |
| | 128 | — | — | — | 37.5 | — | — | 1.5 | — | 61.0 | 2.54 | 500 |
| | 129 | 20.0 | — | — | 17.5 | — | — | 1.5 | — | 61.0 | 3.07 | $10^{-2}$ (vacuum) |
| | 130 | — | — | — | — | 35.0 | TiN: 5.0 | 2.5 | — | 57.5 | 3.85 | 400 (Ar) |
| | 131 | — | — | — | — | 35.0 | VN: 5.0 | 2.5 | — | 57.5 | 3.85 | |
| | 132 | — | — | — | — | 35.0 | NbN: 5.0 | 2.5 | — | 57.5 | 3.85 | |
| | 133 | — | — | — | — | 35.0 | TaN: 5.0 | 2.5 | — | 57.5 | 3.85 | |
| | 134 | 37.5 | — | — | — | — | — | 2.0 | 2.5 | 58.0 | 3.37 | 300 |
| | 135 | — | 35.0 | — | — | — | — | 2.0 | 2.5 | 60.5 | 3.66 | 400 |
| | 136 | — | — | 35.0 | — | — | — | 2.0 | 2.5 | 60.5 | 3.40 | |
| | 137 | — | — | — | 32.5 | — | — | 1.5 | 2.5 | 63.5 | 2.36 | 500 |
| | 138 | — | 17.5 | 17.5 | — | — | — | 2.0 | 2.5 | 60.5 | 3.53 | $10^{-2}$ (vacuum) |
| | 139 | — | — | — | — | 30.0 | TiN: 4.5 | 2.5 | 2.5 | 60.5 | 3.53 | 400 (Ar) |
| | 140 | — | — | — | — | 30.0 | VN: 4.5 | 2.5 | 2.5 | 60.5 | 3.53 | |
| | 141 | — | — | — | — | 30.0 | NbN: 4.5 | 2.5 | 2.5 | 60.5 | 3.53 | |
| | 142 | — | — | — | — | 30.0 | TaN: 4.5 | 2.5 | 2.5 | 60.5 | 3.53 | |

TABLE 15

| | | Composition of Finished Cermet (wt. %) | | | | | | | | | | | |
|---|---|---|---|---|---|---|---|---|---|---|---|---|---|
| | | (Ti,W,Va group metal)CN (atomic ratio) | | | | | | | | | | | |
| | | Ti: 0.65 W: 0.25 Ta: 0.10 C: 0.80 N: 0.20 | Ti: 0.75 W: 0.15 V: 0.10 C: 0.70 N: 0.30 | Ti: 0.75 W: 0.15 Nb: 0.10 C: 0.70 N: 0.30 | Ti: 0.75 W: 0.15 Ta: 0.10 C: 0.70 N: 0.30 | Ti: 0.80 W: 0.12 Ta: 0.08 C: 0.80 N: 0.20 | Ti: 0.60 W: 0.12 Ta: 0.08 V: 0.20 C: 0.80 N: 0.20 | Ti: 0.65 W: 0.13 Ta: 0.09 Nb: 0.13 C: 0.85 N: 0.15 | Ti: 0.70 W: 0.13 Ta: 0.17 C: 0.90 N: 0.10 | MgO | $Al_2O_3$ | W | Carbon Contained in Cermet (wt. %) |
| Cermet of the Present Invention | 125 | 40.8 | — | — | — | — | — | — | — | 0.07 | — | 59.13 | 2.60 |
| | 126 | — | 38.3 | — | — | — | — | — | — | 0.07 | — | 61.63 | 2.91 |
| | 127 | — | — | 38.4 | — | — | — | — | — | 0.07 | — | 61.53 | 2.64 |
| | 128 | — | — | — | 38.4 | — | — | — | — | 0.05 | — | 61.55 | 1.78 |
| | 129 | 20.3 | — | — | 17.7 | — | — | — | — | 0.05 | — | 61.95 | 2.20 |
| | 130 | — | — | — | — | 40.9 | — | — | — | 0.08 | — | 59.02 | 2.69 |
| | 131 | — | — | — | — | — | 40.8 | — | — | 0.08 | — | 59.12 | 2.69 |
| | 132 | — | — | — | — | — | — | 40.9 | — | 0.08 | — | 59.02 | 2.69 |
| | 133 | — | — | — | — | — | — | — | 40.8 | 0.08 | — | 59.12 | 2.69 |
| | 134 | 38.3 | — | — | — | — | — | — | — | 0.07 | 2.35 | 59.28 | 2.37 |
| | 135 | — | 35.7 | — | — | — | — | — | — | 0.07 | 2.37 | 61.86 | 2.63 |
| | 136 | — | — | 35.8 | — | — | — | — | — | 0.07 | 2.37 | 61.76 | 2.40 |
| | 137 | — | — | — | 33.0 | — | — | — | — | 0.05 | 2.38 | 64.57 | 1.53 |
| | 138 | — | 17.7 | 17.8 | — | — | — | — | — | 0.07 | 2.37 | 62.06 | 2.52 |
| | 139 | — | — | — | — | 28.2 | — | — | — | 0.08 | 2.36 | 69.36 | 2.37 |
| | 140 | — | — | — | — | — | 28.1 | — | — | 0.08 | 2.36 | 69.46 | 2.37 |
| | 141 | — | — | — | — | — | — | 28.2 | — | 0.08 | 2.36 | 69.36 | 2.37 |
| | 142 | — | — | — | — | — | — | — | 28.1 | 0.08 | 2.36 | 69.46 | 2.37 |

TABLE 16

| | | Hardness ($H_RA$) | T.R.S. [2] (kg/mm²) | High Speed Continuous Cutting | | Intermittent Cutting Number of Largely Chipped Tools/Number of Tested Tools |
|---|---|---|---|---|---|---|
| | | | | Flank Wear Width (mm) | Crater Depth (μm) | |
| Cermet of the present invention | 125 | 89.7 | 132 | 0.18 | 60 | 0/10 |
| | 126 | 90.0 | 125 | 0.15 | 50 | 1/10 |
| | 127 | 89.8 | 135 | 0.16 | 50 | 0/10 |
| | 128 | 89.3 | 128 | 0.19 | 40 | 1/10 |
| | 129 | 89.5 | 130 | 0.18 | 50 | 1/10 |
| | 130 | 89.8 | 133 | 0.17 | 60 | 0/10 |
| | 131 | 90.0 | 123 | 0.15 | 55 | 2/10 |
| | 132 | 89.8 | 128 | 0.17 | 65 | 1/10 |
| | 133 | 89.9 | 126 | 0.18 | 70 | 2/10 |
| | 134 | 89.9 | 128 | 0.14 | 35 | 1/10 |
| | 135 | 90.2 | 120 | 0.13 | 30 | 1/10 |
| | 135 | 90.0 | 120 | 0.13 | 30 | 1/10 |
| | 136 | 90.0 | 131 | 0.14 | 30 | 0/10 |
| | 137 | 89.6 | 125 | 0.16 | 25 | 1/10 |
| | 138 | 90.1 | 126 | 0.14 | 30 | 1/10 |

TABLE 16-continued

|  | Hardness ($H_RA$) | T.R.S. *2 (kg/mm$^2$) | Flank Wear Width (mm) | Crater Depth ($\mu$m) | Intermittent Cutting Number of Largely Chipped Tools/ Number of Tested Tools |
|---|---|---|---|---|---|
| 139 | 89.9 | 130 | 0.15 | 35 | 0/10 |
| 140 | 90.1 | 120 | 0.13 | 35 | 2/10 |
| 141 | 89.9 | 122 | 0.15 | 40 | 1/10 |
| 142 | 90.0 | 121 | 0.16 | 45 | 2/10 |
| Conventional Inserts 3 | — | — | Plastic Deformation in 3.0 min. | | 3/10 |

It is however noted that the conventional insert 3 could not perform cutting in 3 minutes in the continuous cutting test due to inferior plastic deformation resistance.

EXAMPLE 6

In addition to the MgO powder, the Al$_2$O$_3$ powder, the Y$_2$O$_3$ powder and the W powder as used in Example 1 there were prepared a complete solid solution (Ti$_{0.70}$W$_{0.15}$Ta$_{0.10}$Nb$_{0.05}$)(C$_{0.70}$N$_{0.30}$) powder of an average particle size 1.5 $\mu$m, a Mo powder of an average particle size 0.8 $\mu$m, a Ni powder of an average particle size 2.5 $\mu$m, a Co powder of an average particle size 1.2 $\mu$m and a Re powder of an average particle size 3.0 $\mu$m. These powders were processed in the compositions given in TABLE 17 in the same manner and conditions as in Example 1 to form compacts, which were each sintered in an atmosphere of nitrogen gas of 300 Torr at a temperature set forth in TABLE 17 for two hours to produce cermets 143–162 covered by the present invention and comparative cermets 14–21, the compositions of those alloys being also given in TABLE 17.

The thus-produced cermets 143–162 and comparative cermets 14–21 were each tested as to hardness and the T.R.S. as in Example 1, and were machined into a cutting tool insert in a shape of SNG 433, which is then subjected to the continuous cutting test and intermittent cutting test defined in TABLE 10. The conventional inserts 4 as defined in Example 3 were also subjected to the same tests. The results are given in TABLE 18.

It is seen from TABLE 18 that all the cermets according to the present invention had excellent hardness and toughness and exhibited excellent cutting performances in both the continuous cutting test and the intermittent cutting test.

TABLE 17

| | | Blend Composition (wt. %) | | | | | Carbon Contained in Blend (wt. %) | Sintering Temperature (°C.) | Composition of Resulting Cermet (wt. %) | | | | | Carbon Contained in Cermet (wt. %) |
|---|---|---|---|---|---|---|---|---|---|---|---|---|---|---|
| | | (Ti,W,Ta,Nb)C,N | MgO | Al$_2$O$_3$ | Y$_2$O$_3$ | W | Impurity | | | (Ti,W,Ta,Nb)C,N | MgO | Al$_2$O$_3$ | Y$_2$O$_3$ | W | Impurity | |
| Cermet of the Present Invention | 143 | 40.0 | 9.0 | — | — | 51.0 | — | 3.99 | 2000 | 43.9 | 0.26 | — | — | 55.84 | — | 0.62 |
| | 144 | 35.0 | 7.0 | — | — | 58.0 | — | 3.49 | | 37.7 | 0.20 | — | — | 62.1 | — | 0.85 |
| | 145 | 30.0 | 5.0 | — | — | 65.0 | — | 2.99 | | 31.4 | 0.16 | — | — | 68.44 | — | 1.10 |
| | 146 | 25.0 | 3.0 | — | — | 72.0 | — | 2.50 | 2200 | 25.8 | 0.10 | — | — | 74.1 | — | 1.18 |
| | 147 | 20.0 | 2.0 | — | — | 78.0 | — | 2.00 | | 20.5 | 0.07 | — | — | 79.43 | — | 1.00 |
| | 148 | 15.0 | 2.0 | — | — | 83.0 | — | 1.50 | | 15.3 | 0.07 | — | — | 84.63 | — | 0.60 |
| | 149 | 10.0 | 2.0 | — | — | 88.0 | — | 1.00 | | 10.2 | 0.07 | — | — | 89.73 | — | 0.54 |
| | 150 | 25.0 | 3.0 | — | — | 71.0 | Mo: 1.0 | 2.50 | 2000 | 25.8 | 0.09 | — | — | 73.21 | Mo: 0.9 | 1.19 |
| | 151 | 25.0 | 3.0 | — | — | 71.0 | Ni: 1.0 | 2.50 | | 25.8 | 0.09 | — | — | 73.51 | Ni: 0.6 | 1.17 |
| | 152 | 25.0 | 3.0 | — | — | 71.0 | Co: 1.0 | 2.50 | | 25.8 | 0.09 | — | — | 73.61 | Co: 0.5 | 1.17 |
| | 153 | 25.0 | 3.0 | — | — | 71.0 | Re: 1.0 | 2.50 | | 25.8 | 0.09 | — | — | 73.11 | Re: 1.0 | 1.18 |
| | 154 | 30.0 | 2.0 | 3.0 | — | 65.0 | — | 2.99 | 2200 | 30.7 | 0.07 | 2.82 | — | 66.41 | — | 0.96 |
| | 155 | 25.0 | 2.0 | 5.0 | — | 68.0 | — | 2.50 | | 25.7 | 0.07 | 4.80 | — | 69.43 | — | 0.57 |
| | 156 | 20.0 | 1.0 | 7.0 | — | 72.0 | — | 2.00 | | 20.4 | 0.07 | 6.79 | — | 72.74 | — | 0.43 |

| | | Blend Composition (wt. %) | | | | | Carbon Contained in Blend (wt. %) | Sintering Temperature (°C.) | Finished Cermet Composition (wt. %) | | | | | Carbon Contained in Cermet (wt. %) |
|---|---|---|---|---|---|---|---|---|---|---|---|---|---|---|
| | | (Ti,W,Ta,Nb)C,N | MgO | Al$_2$O$_3$ | Y$_2$O$_3$ | W | Impurity | | | (Ti,W,Ta,Nb)C,N | MgO | Al$_2$O$_3$ | Y$_2$O$_3$ | W | Impurity | |
| Cermet of the Present Invention | 157 | 15.0 | 1.0 | 3.5 | 3.5 | 77.0 | — | 1.50 | 2200 | 15.2 | 0.03 | 3.35 | 3.33 | 78.09 | — | 0.38 |
| | 158 | 10.0 | 1.0 | 9.0 | — | 80.0 | — | 1.00 | | 10.2 | 0.03 | 8.72 | — | 81.05 | — | 0.32 |
| | 159 | 25.0 | 2.0 | 2.5 | 2.5 | 67.0 | Mo: 1.0 | 2.50 | 2000 | 25.7 | 0.07 | 2.40 | 2.38 | 68.55 | Mo: 0.9 | 0.65 |
| | 160 | 25.0 | 2.0 | 2.5 | 2.5 | 67.0 | Ni: 1.0 | 2.50 | | 25.7 | 0.07 | 2.40 | 2.38 | 68.95 | Ni: 0.5 | 0.64 |
| | 161 | 25.0 | 2.0 | 2.5 | 2.5 | 67.0 | Co: 1.0 | 2.50 | | 25.7 | 0.07 | 2.40 | 2.38 | 69.05 | Co: 0.4 | 0.64 |
| | 162 | 25.0 | 2.0 | 2.5 | 2.5 | 67.0 | Re: 1.0 | 2.50 | | 25.7 | 0.07 | 2.40 | 2.38 | 68.45 | Re: 1.0 | 0.65 |
| Comparative Cermet | 14 | 40.0 | 11.0*6 | — | — | 49.0 | — | 3.99 | | 44.9 | 0.42 | — | — | 54.68 | — | 0.30 |
| | 15 | 30.0 | 15.0*6 | 5.0 | — | 50.0 | — | 2.99 | 1800 | 35.4 | 1.08*6 | 4.83 | — | 58.69 | — | 0.55 |
| | 16 | 7.0*6 | 2.0 | — | — | 91.0 | — | 0.70 | 2200 | 7.1*6 | 0.08 | — | — | 92.82 | — | 0.37 |
| | 17 | 7.0*6 | 1.0 | 9.0 | — | 83.0 | — | 0.70 | | 7.1*6 | 0.03 | 8.70 | — | 84.17 | — | 0.31 |
| | 18 | 25.0 | 3.0 | — | — | 69.0 | Ni: 3.0*6 | 2.50 | 1800 | 25.8 | 0.09 | — | — | 71.61 | Ni: 2.5*6 | 1.37 |
| | 19 | 25.0 | 2.0 | 5.0 | — | 65.0 | Ni: 3.0*6 | 2.50 | | 25.7 | 0.08 | 4.81 | — | 66.91 | Ni: 2.5*6 | 1.10 |
| | 20 | 30.0 | 5.0 | — | — | 65.0 | — | 2.50 | 1700*6 | 31.4 | 1.15*6 | — | — | 67.45 | — | 2.19 |
| | 21 | 25.0 | 5.0 | 5.0 | — | 65.0 | — | 2.50 | | 26.0 | 1.08*6 | 4.83 | — | 68.09 | — | 1.88 |

*6 not fallen within the scope of the present invention.

TABLE 18

|  |  | Hardness (H$_R$A) | T.R.S.*2 (kg/mm²) | High Speed Continuous Cutting | | Intermittent Cutting Number of Largely Chipped Tools/ Number of Tested Tools |
|---|---|---|---|---|---|---|
|  |  |  |  | Flank Wear Width (mm) | Crater Depth (μm) |  |
| Cermet of the present invention | 143 | 87.8 | 103 | 0.23 | 55 | 2/10 |
|  | 144 | 88.2 | 118 | 0.21 | 55 | 1/10 |
|  | 145 | 88.5 | 129 | 0.20 | 55 | 0/10 |
|  | 146 | 88.6 | 134 | 0.20 | 55 | 0/10 |
|  | 147 | 88.3 | 128 | 0.22 | 60 | 0/10 |
|  | 148 | 87.7 | 120 | 0.24 | 65 | 1/10 |
|  | 149 | 87.3 | 115 | 0.28 | 80 | 2/10 |
|  | 150 | 88.3 | 125 | 0.25 | 60 | 1/10 |
|  | 151 | 88.0 | 122 | 0.26 | 65 | 1/10 |
|  | 152 | 88.0 | 123 | 0.26 | 65 | 1/10 |
|  | 153 | 88.5 | 130 | 0.21 | 55 | 0/10 |
|  | 154 | 88.7 | 122 | 0.15 | 35 | 1/10 |
|  | 155 | 88.7 | 118 | 0.17 | 30 | 1/10 |
|  | 156 | 88.4 | 108 | 0.19 | 20 | 2/10 |
|  | 157 | 88.0 | 107 | 0.21 | 25 | 2/10 |
|  | 158 | 87.6 | 98 | 0.23 | 20 | 3/10 |
|  | 159 | 88.4 | 111 | 0.20 | 35 | 2/10 |
|  | 160 | 88.3 | 106 | 0.24 | 40 | 2/10 |
|  | 161 | 88.3 | 105 | 0.24 | 40 | 2/10 |
|  | 162 | 88.4 | 110 | 0.19 | 30 | 1/10 |
| Comparative Cermet | 14 | 86.8 | 73 | Plastic Deformation in 1.2 min. | | 7/10 |
|  | 15 | 86.7 | 54 | Large Chipping in 1.0 min. | | 10/10 |
|  | 16 | 86.1 | 55 | Plastic Deformation in 0.7 min. | | 8/10 |
|  | 17 | 86.5 | 50 | Plastic Deformation in 0.8 min. | | 9/10 |
|  | 18 | 86.9 | 62 | Plastic Deformation in 0.8 min. | | 9/10 |
|  | 19 | 86.8 | 62 | Plastic Deformation in 0.7 min. | | 9/10 |
|  | 20 | 86.1 | 43 | Large Chipping in 0.5 min. | | 10/10 |
|  | 21 | 86.0 | 40 | Large Chipping in 0.5 min. | | 10/10 |
| Conventional Inserts | 4 | — | — | Plastic Deformation in 0.9 min. | | 2/10 |

Further, it is clear from the results of the tests on cermets 150-153 and 159-162 that not larger than above 1% of an impurity, such as Mo, Ni, Co or Re, does not adversely affect the properties of those alloys. In contrast, poor cutting performances due to lack of toughness were noted in the comparative cermets 14 and 15 which contain MgO beyond the upper limit concentrations of the present invention, the comparative cermets 16 and 17 which contain the carbonitrides below the lower limit concentration of the present invention, the comparative cermets 18 and 19 which contain more than about 1% by weight of Ni as an impurity and the comparative cermets 20 and 21 which were sintered below the lower temperature limit of the present invention. With respect to the conventional insert 4, it was noted that in the high feed continuous cutting test it could not perform cutting in 0.9 min. due to inferior plastic deformation resistance although it exhibited excellent impact resistance to the same degree as the cermets according to the present invention.

EXAMPLE 7

Cutting tool inserts were prepared by machining the cermets 4, 16, 17, 104, 114 and 115 of the present invention into a standard SNG 433 shape, and were coated by conventional chemical vapour deposition to form one or more surface coating layers to thereby produce coated inserts 1-18. The compositions and average thickness of the coated layers are given in TABLE 19. Cutting tests were made on these inserts on the same conditions as in Example 1. The results are also set forth in TABLE 19 from which it is seen that all the inserts fallen within the scope of the present invention exhibited excellent wear resistance in both of the cutting tests.

TABLE 19

| Coated Insert | Composition of Insert Substrate (wt. %) | Coating Composition | A. T.*7 (μm) | High Feed Continuous Cutting | | Intermittent Cutting Ratio of Largely Chipped Tools/ Tested Tools |
|---|---|---|---|---|---|---|
|  |  |  |  | Flank Wear Width (mm) | Crater Depth (μm) |  |
| 1 | (Ti$_{0.85}$W$_{0.15}$). (C$_{0.7}$N$_{0.3}$): 48.5 MgO: 0.07 W: 51.43 | C$_{0.7}$N$_{0.3}$ | 6 | 0.13 | 35 | 1/10 |
| 2 |  | T: Al$_2$O$_3$ B: TiC$_{0.5}$N$_{0.5}$ | 2 4 | 0.11 | 20 | 2/10 |

TABLE 19-continued

| Coated Insert | Composition of Insert Substrate (wt. %) | Coating Composition | A. T.[7] ($\mu$m) | High Feed Continuous Cutting | | Intermittent Cutting |
|---|---|---|---|---|---|---|
| | | | | Flank Wear Width (mm) | Crater Depth ($\mu$m) | Ratio of Largely Chipped Tools/ Tested Tools |
| 3*[8] | | T: $Al_2O_3$ | 1 | | | |
| | | I: $TiC_{0.7}O_{0.3}$ | 1 | 0.12 | 25 | 1/10 |
| | | B: $TiC_{0.8}N_{0.2}$ | 4 | | | |
| 4 | $(Ti_{0.85}W_{0.15})\cdot$ | T: $AlO_{0.7}N_{0.3}$ | 2 | 0.10 | 20 | 3/10 |
| | $(C_{0.7}N_{0.3})$: 48.4 | B: HfN | 4 | | | |
| 5 | MgO: 0.05 | T: HfC | 1 | 0.09 | 20 | 3/10 |
| | $Al_2O_3$: 1.84 | I: $Al_2O_3$ | 2 | | | |
| | $Y_2O_3$: 0.89 | B: $TiC_{0.7}N_{0.3}$ | 4 | | | |
| 6 | W: 48.82 | $TiC_{0.6}N_{0.4}$ | 6 | 0.11 | 25 | 2/10 |
| 7 | $(Ti_{0.85}W_{0.15})\cdot$ | TiN | 7 | 0.11 | 20 | 1/10 |
| | $(C_{0.7}N_{0.3})$: 53.8 | | | | | |
| 8 | MgO: 0.06 | $Al_2O_3$ | 3 | 0.08 | 10 | 3/10 |
| | $Al_2O_3$: 2.86 | | | | | |
| 9 | W: 43.28 | T: $ZrC_{0.6}N_{0.4}$ | 2 | 0.09 | 15 | 2/10 |
| | | B: $TiC_{0.6}N_{0.4}$ | 5 | | | |
| 10 | $(Ti_{0.75}W_{0.15}$ | TiC | 7 | 0.12 | 35 | 1/10 |
| | $Ta_{0.10})(C_{0.7}N_{0.3})$: 48.4 | | | | | |
| | MgO: 0.07 | | | | | |
| | W: 51.53 | | | | | |
| 11 | | T: $Al_2O_3$ | 2 | 0.10 | 15 | 1/10 |
| | | B: $TiC_{0.7}N_{0.3}$ | 4 | | | |
| 12 | | T: $Al_2O_3$ | 1 | | | |
| | | I: $TiC_{0.4}N_{0.4}O_{0.2}$ | 1 | 0.10 | 15 | 1/10 |
| | | B: TiC | 4 | | | |
| 13 | $(Ti_{0.75}W_{0.15}Ta_{0.10})$ | T: ZrC | 2 | 0.09 | 25 | 3/10 |
| | $(C_{0.7}N_{0.3})$: 45.9 | B: TiC | 5 | | | |
| 14 | MgO: 0.03 | T: $AlO_{0.6}N_{0.4}$ | 2 | 0.08 | 15 | 3/10 |
| | $Al_2O_3$: 1.38 | B: TiN | 4 | | | |
| 15 | $Y_2O_3$: 1.35 | T: $HfC_{0.2}N_{0.8}$ | 2 | 0.09 | 20 | 2/10 |
| | W: 51.34 | B: TiC | 4 | | | |
| 16 | $(Ti_{0.75}W_{0.15}$ | T: TiN | 3 | 0.09 | 15 | 1/10 |
| | $Ta_{0.10})(C_{0.7}N_{0.3})$: 48.5 | B: TiC | 4 | | | |
| 17 | MgO: 0.05 | | | | | |
| | $Al_2O_3$: 2.36 | $TiC_{0.8}N_{0.2}$ | 7 | 0.09 | 15 | 2/10 |
| 18 | W: 49.09 | T: $Al_2O_3$ | 2 | 0.08 | 10 | 3/10 |
| | | B: TiC | 4 | | | |

*[7]A.T. stands for the average thickness of each coating layer.
*[8]The substrate of coated insert No. 3 consisted of 48.5 wt. % $(Ti_{0.85}W_{0.15})(C_{0.7}N_{0.3})$, 0.07 wt. % MgO and 51.43 wt. % W and was coated with an $Al_2O_3$ top layer (T) of 1 $\mu$m average thickness, a $TiC_{0.7}O_{0.3}$ intermediate layer (I) of 1 $\mu$m average thickness and a $TiC_{0.8}N_{0.2}$ bottom layer (B) of 4 $\mu$m average thickness.

EXAMPLE 8

Cutting tool inserts were prepared by machining the cermets 26, 58 and 134 of the present invention into a standard SNG 433 shape, and were coated by conventional physical vapor deposition to form one or more surface coating layers to thereby produce coated inserts 19-27. The compositions and average thickness of the coated layers are given in TABLE 20. Cutting tests were carried out on these inserts on the same conditions as in Example 2. The results are also set forth in TABLE 20, from which it is seen that the inserts 19-27, which are fallen within the scope of the present invention, exhibited excellent wear resistance in both of the cutting tests.

TABLE 20

| Coated Insert | Composition of Insert Substrate (wt. %) | Coating Composition | A. T.[7] ($\mu$m) | High Feed Continuous Cutting | | Intermittent Cutting |
|---|---|---|---|---|---|---|
| | | | | Flank Wear Width (mm) | Crater Depth ($\mu$m) | Ratio of Largely Chipped Tools/ Tested Tools |
| 19 | $(Ti_{0.85}W_{0.15})\cdot$ | TiN | 4 | 0.11 | 20 | 1/10 |
| 20 | $(C_{0.7}N_{0.3})$: 36.1 | TiC | 3 | 0.10 | 25 | 2/10 |
| 21 | MgO: 0.09 | $TiC_{0.5}N_{0.5}$ | 4 | 0.10 | 20 | 1/10 |
| | W: 63.81 | | | | | |
| 22 | $(Ti_{0.80}W_{0.20})\cdot$ | T: TiC | 2 | 0.09 | 10 | 2/10 |
| | $(C_{0.7}N_{0.3})$: 30.7 | B: TiN | 2 | | | |
| 23 | MgO: 0.07 | T: TiN | 1 | | | |
| | $Al_2O_3$: 4.72 | I: TiC | 1 | 0.10 | 10 | 2/10 |
| | W: 64.51 | B: TiN | 2 | | | |
| 24 | | TiN | 4 | 0.11 | 15 | 2/10 |
| 25 | $(Ti_{0.65}W_{0.25}Ta_{0.10})$ | TiN | 3 | 0.09 | 15 | 2/10 |
| | $(C_{0.8}N_{0.2})$: 38.3 | | | | | |
| 26 | MgO: 0.07 | TiC | 3 | 0.08 | 20 | 3/10 |
| 27 | $Al_2O_3$: 2.35 | T: $TiC_{0.5}N_{0.5}$ | 1 | 0.08 | 15 | 2/10 |

TABLE 20-continued

| Coated Insert | Composition of Insert Substrate (wt. %) | Coating Composition | A. T.*7 (μm) | High Feed Continuous Cutting | | Intermittent Cutting |
| --- | --- | --- | --- | --- | --- | --- |
| | | | | Flank Wear Width (mm) | Crater Depth (μm) | Ratio of Largely Chipped Tools/ Tested Tools |
| | W: 59.28 | B: TiN | 2 | | | |

What is claimed is:

1. A super heat resistant cermet consisting essentially of about 10 to about 65% by weight of a solid solution carbonitride containing titanium and tungsten, about 0.01 to about 1.0% by weight of magnesium oxide, and not more than about 1% by weight of inevitable impurities, balance tungsten.

2. A super heatresistant cermet as recited in claim 1 wherein the carbonitride comprises about 25 to about 55% by weight of the cermet, and wherein the magnesium oxide comprises about 0.03 to about 0.2% by weight of the cermet.

3. A super heat resistant cermet as recited in claim 2 further comprising yttrium oxide and/or aluminum oxide in an amount of about 0.5 to about 10% by weight thereof.

4. A super heatresistant cermet as recited in claim 2 further comprising yttrium oxide and/or the aluminum oxide comprises about 2 to about 6% by weight of the cermet.

5. A super heatresistant cermet as recited in claim 4 wherein the carbonitride further includes at least one element selected from Va group metals.

6. A super heatresistant cermet as recited in claim 1, further comprising yttrium oxide and/or aluminum oxide in an amount of about 0.5 to about 10% by weight thereof.

7. A super heat resistant cermet as recited in claim 6 wherein the carbonitride further includes at least one group Va metal M', M", and M''' represented as $$(Ti_a, W_b, M'_c, M''_d, M'''_e)(C_xN_y)$$

wherein a, b, c, d, e, x and y represent the atomic ratios respectively and wherein $a+b+c+d+e=1$ and $x+y=1$.

8. A super heat resistant cermet as recited in claim 1 wherein the carbonitride further includes at least one group Va metal M', M" and M''' represented as $$(Ti_a, W_b, M'_c, M''_d, M'''_e)(C_xN_y)$$

wherein a, b, c, d, e, x and y represent the atomic ratios respectively and wherein $a+b+c+d+e=1$ and $x+y=1$.

9. A blade member for cutting tools, formed from the cermet as recited in claim 1 wherein the blade member is coated with at least one layer composed of one substance selected from the group consisting of an oxide and an oxynitride of aluminum; a carbide, a nitride, a carbonitride and an oxycarbonitride of titanium; a carbide, a nitride, a carbonitride and an oxycarbonitride of zirconium; and a carbide, a nitride, a carbonitride and an oxycarbonitride of hafnium.

10. A process of producing a super heatresistant cermet comprising the steps of:

(a) mixing about 10 to about 65% by weight of a powder of a carbonitride containing titanium and tungsten, about 0.5 to about 10.0% by weight of a magnesium oxide powder, and a tungsten powder to form a mixture;

(b) compacting the mixture to form a compact;

(c) sintering the compact in a vacuum or in an atmosphere of a nitrogen gas or an inert gas within the temperature range of about 1800° C. to about 2700° C. to thereby decarburize the carbonitride with the magnesium oxide evaporated during the sintering step; and (d) whereby there is produced the cermet containing about 10 to about 65% by weight of the carbonitride, about 0.01 to about 1.0% by weight of magnesium oxide and tungsten.

11. A process of producing a super heatresistant cermet as recited in claim 10 wherein the carbonitride in the powder further includes at least one element selected from Va group metals.

12. A process of producing a super heatresistant cermet as recited in claim 10 wherein in the step (a) an aluminum oxide powder and/or an yttrium oxide powder is mixed in an amount of about 0.5 to about 10% by weight of the mixture with the carbonitride powder, the magnesium oxide powder and the tungsten powder, whereby the cermet produced contains approximately the same amount of the aluminum oxide and/or the yttrium oxide as the mixture.

13. A blade member for cutting tools, formed from the cermet as recited in claim 2 wherein the blade member is coated with at least one layer composed of one substance selected from the group consisting of an oxide and an oxynitride of aluminum; a carbide, a nitride, a carbonitride and an oxycarbonitride of titanium; a carbide, a nitride, a carbonitride and an oxycarbonitride of zirconium; and a carbide, a nitride, a carbonitride and an oxycarbonitride of hafnium.

14. A blade member for cutting tools, formed from the cermet as recited in claim 3 wherein the blade member is coated with at least one layer composed of one substance selected from the group consisting of an oxide and an oxynitride of aluminum; a carbide, a nitride, a carbonitride and an oxycarbonitride of titanium; a carbide, a nitride, a carbonitride and an oxycarbonitride of zirconium; and a carbide, a nitride, a carbonitride and an oxycarbonitride of hafnium.

15. A blade member for cutting tools, formed from the cermet as recited in claim 4 wherein the blade member is coated with at least one layer composed of one substance selected from the group consisting of an oxide and an oxynitride of aluminum; a carbide, a nitride, a carbonitride and an oxycarbonitride of titanium; a carbide, a nitride, a carbonitride and an oxycarbonitride of zirconium; and a carbide, a nitride, a carbonitride and an oxycarbonitride of hafnium.

16. A blade member for cutting tools, formed from the cermet as recited in claim 5 wherein the blade member is coated with at least one layer composed of one substance selected from the group consisting of an oxide and an oxynitride of aluminum; a carbide, a nitride, a carbonitride and an oxycarbonitride of titanium; a carbide, a nitride, a carbonitride and an oxycarbonitride of zirconium; and a carbide, a nitride, a carbonitride and an oxycarbonitride of hafnium.

17. A blade member for cutting tools, formed from the cermet as recited in claim 6 wherein the blade member is coated with at least one layer composed of one substance selected from the group consisting of an oxide and an oxynitride of aluminum; a carbide, a nitride, a carbonitride and an oxycarbonitride of titanium; a carbide, a nitride, a carbonitride and an oxycarbonitride of zirconium; and a carbide, a nitride, a carbonitride and an oxycarbonitride of hafnium.

18. A blade member for cutting tools, formed from the cermet as recited in claim 7 wherein the blade member is coated with at least one layer composed of one substance selected from the group consisting of an oxide and an oxynitride of aluminum; a carbide, a nitride, a carbonitride and an oxycarbonitride of titanium; a carbide, a nitride, a carbonitride and an oxycarbonitride of zirconium; and a carbide, a nitride, a carbonitride and an oxycarbonitride of hafnium.

19. A blade member for cutting tools, formed from the cermet as recited in claim 8 wherein the blade member is coated with at least one layer composed of one substance selected from the group consisting of an oxide and an oxynitride of aluminum; a carbide, a nitride, a carbonitride and an oxycarbonitride of titanium; a carbide, a nitride, a carbonitride and an oxycarbonitride of zirconium; and a carbide, a nitride, a carbonitride and an oxycarbonitride of hafnium.

20. A process of producing a super heatresistant cermet as recited in claim 11 wherein in the step (a) an aluminum oxide powder and/or an yttrium oxide powder is mixed in an amount of about 0.5 to about 10% by weight of the mixture with the carbonitride powder, the magnesium oxide powder and the tungsten powder, whereby the cermet produced contains approximately the same amount of the aluminum oxide and/or the yttrium oxide as the mixture.

* * * * *